(12) United States Patent
Lueking et al.

(10) Patent No.: US 7,754,179 B2
(45) Date of Patent: Jul. 13, 2010

(54) LOWER PRESSURE SYNTHESIS OF DIAMOND MATERIAL

(75) Inventors: Angela Lueking, State College, PA (US); Humberto Gutierrez, State College, PA (US); Deepa Narayanan, Redmond, WA (US); Caroline E. Burgess Clifford, State College, PA (US); Puja Jain, King Of Prussia, PA (US)

(73) Assignee: The Penn State Research Foundation, University Park, PA (US)

( * ) Notice: Subject to any disclaimer, the term of this patent is extended or adjusted under 35 U.S.C. 154(b) by 447 days.

(21) Appl. No.: 11/613,968

(22) Filed: Dec. 20, 2006

(65) Prior Publication Data

US 2007/0148080 A1 Jun. 28, 2007

Related U.S. Application Data

(60) Provisional application No. 60/752,507, filed on Dec. 21, 2005, provisional application No. 60/752,506, filed on Dec. 21, 2005.

(51) Int. Cl.
*B01J 3/06* (2006.01)
*C10L 5/00* (2006.01)
(52) U.S. Cl. .................................. 423/446; 44/500
(58) Field of Classification Search .................. None
See application file for complete search history.

(56) References Cited

U.S. PATENT DOCUMENTS

| | | | |
|---|---|---|---|
| 4,035,472 A | 7/1977 | Tominaga | |
| 4,292,164 A * | 9/1981 | Derbyshire et al. | 208/418 |
| 4,379,077 A * | 4/1983 | Solomon | 502/101 |
| 4,613,084 A * | 9/1986 | Takamoto et al. | 241/16 |
| 4,668,496 A * | 5/1987 | Korb et al. | 423/445 R |
| 4,882,138 A | 11/1989 | Pinneo | |
| 5,417,953 A | 5/1995 | Cappelli | |
| 5,756,061 A | 5/1998 | White | |
| 5,891,241 A | 4/1999 | Yoshida et al. | |
| 5,980,852 A | 11/1999 | Burns et al. | |
| 6,129,900 A | 10/2000 | Satoh et al. | |
| 6,596,055 B2 | 7/2003 | Cooper et al. | |
| 6,626,981 B2 | 9/2003 | Wojtowicz et al. | |
| 2007/0028509 A1 * | 2/2007 | Dobbs et al. | 44/500 |
| 2007/0144063 A1 | 6/2007 | Lueking et al. | |

OTHER PUBLICATIONS

Dobbs et al. U.S. Appl. No. 60/704,040 for U.S. Pub. No. 2007/0028509.*

(Continued)

*Primary Examiner*—Melvin C Mayes
*Assistant Examiner*—Guinever S Gregorio
(74) *Attorney, Agent, or Firm*—Gifford, Krass, Sprinkle, Anderson & Citkowski, P.C.

(57) ABSTRACT

Methods of synthesizing a diamond material, particularly nanocrystalline diamond, diamond-like carbon and bucky diamond are provided. In particular embodiments, a composition including a carbon source, such as coal, is subjected to addition of energy, such as high energy reactive milling, producing a milling product enriched in hydrogenated tetrahedral amorphous diamond-like carbon compared to the coal. A milling product is treated with heat, acid and/or base to produce nanocrystalline diamond and/or crystalline diamond-like carbon. Energy is added to produced crystalline diamond-like carbon in particular embodiments to produce bucky diamonds.

21 Claims, 9 Drawing Sheets

OTHER PUBLICATIONS

"Physics and Advanced Technologies. Lawrence Livermore National Laboratory Annual Report, Dec. 2003," Dec. 2003, p. 20, Figure 5.

Fitzer, E., K.H. Kochling, H.P. Boehm, and H. Marsh. "Recommended Terminology for the Description of Carbon as a Solid." Pure and Applied Chemistry, vol. 67, No. 3, p. 473-506 (1995).

Zhang, D. And R.Q. Zhang. "Signature of Nanodiamond in Raman Spectra: A Density Functional Theoretical Study." Journal of Physical Chemistry B, vol. 109, No. 18, p. 9006-9013 (2005).

Basca, W.S., J.S. Lannin, D.L. Pappas, and J.J. Cuomo. "Raman scattering of laser-deposited amorphous carbon." Physical Review B, vol. 47, No. 16, p. 10931-10934 (Apr. 15, 1993).

Ferrari, A.C. and J. Robertson. "Resonant Raman spectroscopy of disordered, amorphous, and diamondlike carbon." Physical Review B, vol. 64, No. 7, p. 075414-1 to 075414-13 (2001).

Ichikawa, T., D.M. Chen, S. Isobe, E. Gomibuchi, and H. Fujii. "Hydrogen storage properties on mechanically milled graphite." Materials Science and Engineering B, vol. 108, p. 138-142 (2004).

Tan, P., S. Dimovski, and Y. Gogotsi. "Raman scattering of non-planar graphite: arched edges, polyhedral crystals, whiskers and cones." Philosophical Transactions of the Royal Society A, vol. 362, p. 2289-2310 (2004).

Ferrari, A.C. and J. Robertson. "Interpretation of Raman spectra of disordered and amorphous carbon." Physical Review B, vol. 61, No. 20, p. 14095-14107 (2000).

Osswald, S., G. Yushin, V. Mochalin, S.O. Kucheyev, and Y. Gogotsi. "Control of $sp^2/sp^3$ Carbon Ratio and Surface Chemistry of Nanodiamond Powders by Selective Oxidation in Air." Journal of the American Chemical Society, vol. 128, No. 35, p. 11635-11642 (2006).

Lee, C.T., M.S. Odziemkowski, and D.W. Shoesmith. "An in Situ Raman-Electrochemical Investigation of Carbon Steel Corrosion in $Na_2CO_3/NaHCO_3$, $Na_2SO_4$, and NaCl Solutions." Journal of the Electrochemical Society, vol. 153, No. 2, p. B33-B41 (2006).

Talyzin, A.V. And U. Jansson. "A comparative Raman study of some transition metal fullerides." Thin Solid Films, vol. 429, p. 96-101 (2003).

McGuire, K., N. Gothard, P.L. Gai, M.S. Dresselhaus, G. Sumanasekera, A.M. Rao. "Synthesis and Raman characterization of boron-doped single-walled carbon nanotubes." Carbon, vol. 43, p. 219-227 (2005).

Sato, Y., M. Kamo, and N. Setaka. "Raman spectra of carbons at 2600-3300$cm^{-1}$ region." Carbon, vol. 16, p. 279-280 (1978).

Orimo, S., T. Matsushima, H. Fujii, T. Fukunaga, and G. Majer. "Hydrogen desorption property of mechanically prepared nanostructured graphite." Journal of Applied Physics, vol. 90, No. 3, p. 1545-1549 (2001).

Prawer, S., K.W. Nugent, D.N. Jamieson, J.O. Orwa, L.A. Bursill, J.L. Peng. "The Raman spectrum of nanocrystalline diamond." Chemical Physical Letters, vol. 332, p. 93-97 (2000).

Caplan, D., G.I. Sproule, R.J. Hussey, and M.J. Graham. "Oxidation of Fe-C Alloys at 500°C." Oxidation of Metals, vol. 12, No. 1, p. 67-82 (1978).

Kuznetsov, V.L., A.L. Chuvilin, Y.V. Butenko, I.Y. Mal'kov, and V.M. Titov. "Onion-like carbon from ultra-disperse diamond." Chemical Physical Letters, vol. 222, No. 4, p. 343-348 (1994).

Banhart, F. and P.M. Ajayan. "Carbon onions as nanoscopic pressure cells for diamond formation." Nature, vol. 382, p. 433-435 (1996).

Banhart, F. and P.M. Ajayan. "Self-Compression and Diamond Formation in Carbon Onions." Advanced Materials, vol. 9, No. 3, p. 261-263 (1997).

Zaiser, M., Y. Lyutovich, and F. Banhart. "Irradiation-induced transformation of graphite to diamond: A quantitative study." Physical Review B, vol. 62, No. 5, p. 3058-3064 (2000).

Zaiser, M. and F. Banhart. "Radiation-Induced Transformation of Graphite to Diamond." Physical Review Letters, vol. 79, No. 19, p. 3680-3683 (Nov. 10, 1997).

Kuznetsov, V.L., Y.V. Butenko, V.I. Zaikovskii, and A.L. Chuvilin. "Carbon redistribution processes in nanocarbons." Carbon, vol. 42, No. 5-6, p. 1057-1061 (2004).

Yusa, H. "Nanocrystalline diamond directly transformed from carbon nanotubes under high pressure." Diamond and Related Materials, vol. 11, p. 87-91 (2002).

* cited by examiner

FIG - 4A    FIG - 4B
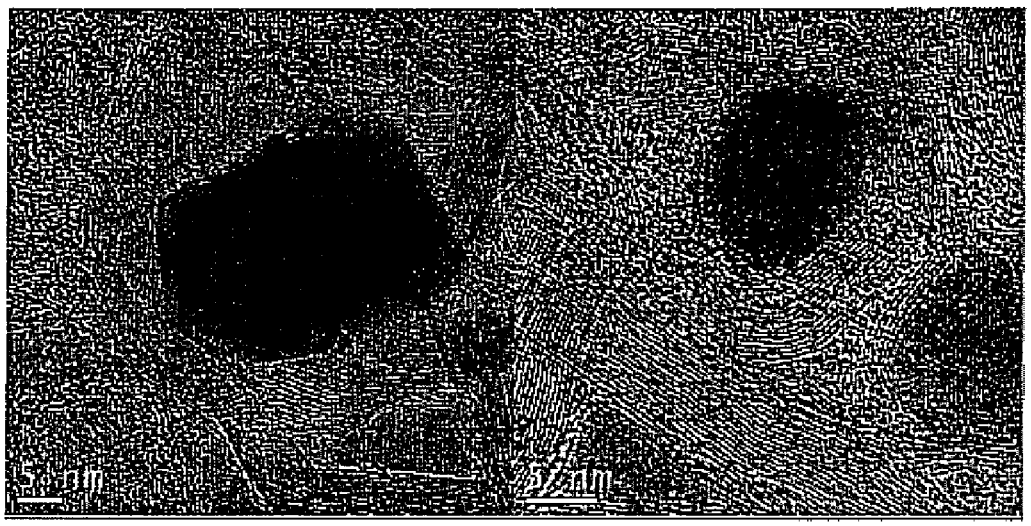
FIG - 4C    FIG - 4D
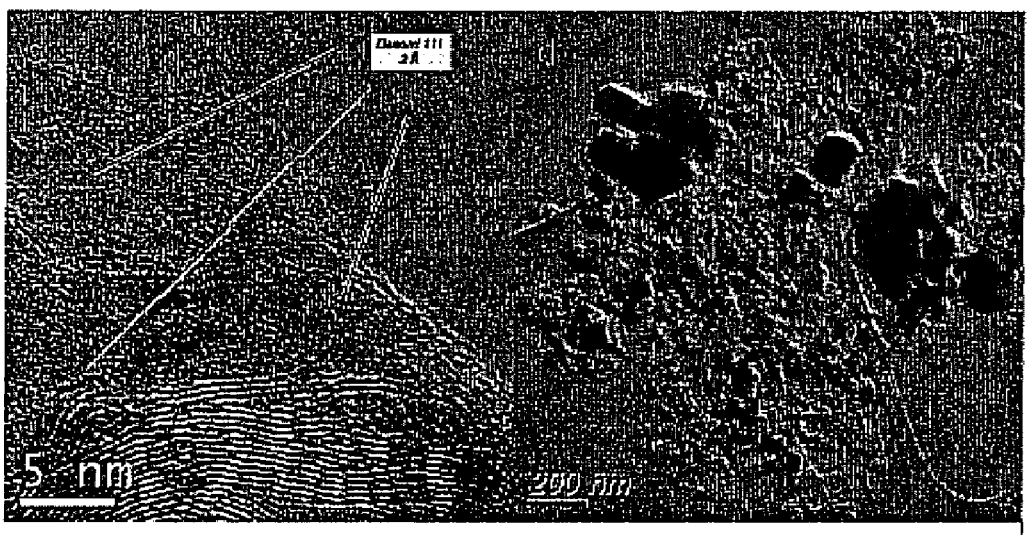

LOWER PRESSURE SYNTHESIS OF DIAMOND MATERIAL

REFERENCE TO RELATED APPLICATIONS

This application claims priority of U.S. Provisional Patent Application Ser. Nos. 60/752,506 filed Dec. 21, 2005, and 60/752,507 filed Dec. 21, 2005, both of which are incorporated herein by reference in their entirety.

GOVERNMENT SPONSORSHIP

Research carried out in connection with this invention is supported in part by Department of Energy Grant No. DEFC2603NT41874. Accordingly, the United States government may have certain rights in the invention.

FIELD OF THE INVENTION

The present invention relates generally to methods of synthesis of carbon-based structures. In particular, the present invention relates to methods of synthesis of crystalline carbons, nanocrystalline diamond and diamond-like carbons. The present invention also relates to compositions including crystalline carbons, nanocrystalline diamond and/or diamond-like carbons.

BACKGROUND OF THE INVENTION

Natural diamond is produced in high pressure and high temperature volcanic shafts, and the scarcity and cost of natural diamond has stimulated synthetic diamond research for over 100 years. Diamond synthesis requires high energy inputs, as diamond is not the thermodynamically stable form of carbon at ambient conditions. Diamond is, however, more thermodynamically stable than amorphous carbon Generally, diamond is synthesized at high pressure (~1-10 GPa) where diamond is the thermodynamically preferred form of carbon, and at high temperatures (T>2000 K) to overcome the kinetic barriers of the solid-phase conversion of graphite to diamond. In addition to the high-pressure, high-temperature conversion from graphite into diamond, synthetic diamond is currently produced via either chemical vapor deposition or explosive detonation.

Diamonds are valued for superior hardness and thus have uses in many industries. For example, diamonds are used as abrasives as well as in cutting tools and drills. Diamond size is important in defining the specific uses of the material and smaller sizes are particularly desired as fine abrasives, for instance. However, methods of producing diamond materials and other forms of diamond, including crystalline carbon, nanocrystalline diamond and "diamond-like carbon," often involve very high pressure and temperatures, making their synthesis difficult.

Thus, there is a continuing need for methods and compositions relating to synthesis of carbon-based structures including crystalline carbons, nanocrystalline diamond and diamond-like carbons. In particular, there is a continuing need for relatively low system pressure methods for synthesis of carbon-based structures including crystalline carbons, nanocrystalline diamond and diamond-like carbons.

SUMMARY OF THE INVENTION

A process according to embodiments of the present invention includes adding energy to a composition including a carbon source to produce a diamond material. In particular embodiments, energy added is kinetic energy. In further particular embodiments, a carbon source is a carbonaceous material.

A process for synthesizing a carbon material is provided including subjecting a composition including a carbon source to added energy under system reaction conditions, producing a product. The product is exposed to thermal treatment, an acid, a base, or a combination thereof, thereby synthesizing a diamond material.

A process for synthesizing a diamond-like carbon is provided including subjecting a composition including a carbon source to added energy under system reaction conditions, producing a product. The product is exposed to an acid, a base, or a combination thereof, thereby synthesizing a diamond-like carbon.

A process for making a diamond material is provided which includes subjecting a composition including a carbonaceous material to high kinetic energy milling. A particular high kinetic energy milling includes ball milling.

A specific carbonaceous material includes at least 30% carbon by weight. In further particular embodiments a carbonaceous material includes an amorphous carbon material and/or a crystalline carbon material.

A particular carbonaceous material included in a composition subjected to high energy kinetic milling in embodiments of methods according to the present invention includes coal such as anthracite coal, lignite coal, bituminous coal, sub-bituminous coal and combinations of these or other carbonaceous materials.

A further exemplary carbonaceous material is a graphite.

In particular embodiments, a diamond material produced according to a method of the present invention has a particle size in the range between about 1 nanometer and 10 millimeters, inclusive. In further embodiments, a diamond material has a particle size in the range between about 1 nanometer and 1 micrometer and in yet further embodiments a diamond material has a particle size in the range between about 1 nanometer and 75 nanometers. Yet further, a a diamond material produced according to the present invention has a particle size in the range between about 1 nanometer and 50 nanometers.

In specific embodiments, a a diamond material produced is generally spherical or nearly spherical.

Methods according to the present invention are provided for synthesizing a bucky diamond in particular embodiments. In particular, a diamond-like carbon produced according to embodiments of the present invention is a precursor material to a bucky diamond. Energy is added to the precursor material to induce formation of a bucky diamond.

In particular embodiments, a composition subjected to high energy kinetic milling including a carbonaceous material further includes a hydrocarbon. A carbonaceous material may further include a transition metal, an alkaline earth metal, an alkali metal, a non-metal, or a combination of two or more of these. A composition subjected to high energy kinetic milling including a carbonaceous material optionally includes a hydrogen source.

A process for synthesizing a diamond material is provided including subjecting a composition including a carbon source to energy milling under system reaction conditions, producing a product. In particular embodiments the product is enriched in tetrahedral amorphous diamond-like carbon compared to the carbon source. In further particular embodiments the milled product is enriched in hydrogentated tetrahedral amorphous diamond-like carbon compared to the carbon source.

A process for synthesizing a diamond material is provided including subjecting a composition including coal to high kinetic energy milling under system reaction conditions, producing a milled product. In particular embodiments the milled product is enriched in tetrahedral amorphous diamond-like carbon compared to the coal. In further particular embodiments the milled product is enriched in hydrogenated tetrahedral amorphous diamond-like carbon compared to the coal.

Optionally, a process for synthesizing a diamond material further includes treating the milled product with a treatment selected from the group consisting of: heating, exposure to an acid, exposure to a base, and a combination thereof.

In certain embodiments, system reaction conditions include a system pressure in the range of 0.1-50 atm. In preferred embodiments, system reaction conditions include a system pressure in the range of 0.9-10 atm. In addition, system reaction conditions may include a system temperature in the range of 0-100° C. in particular embodiments. In preferred embodiments, the system reaction conditions include a system temperature in the range of 10-40° C. In general, a system includes a reactor and reactants. A moderate temperature for reaction conditions in a reaction system is in the range of about 0-100° C., inclusive and a moderate pressure is in the range of about about 0-10 atm, inclusive. In further embodiments, a moderate temperature for reaction conditions in a reaction system is in the range of about 10-40° C., inclusive. In particular embodiments, no heat is added to a reaction system, such as a reactor and reactants. It is appreciated that addition of kinetic energy to a reaction system may increase the temperature of the reaction system due to friction, for instance. Thus, the reaction system temperature in a system run with no added heat may be elevated above room temperature due to such friction and/or other operational and/or reaction sources. However, friction and/or other operational and/or reaction sources do not result in reaction conditions appreciably over 100° C.

Optionally, the composition further includes a hydrogen source in particular embodiments. A hydrogen source is illustratively an organic source such as a hydrocarbon and/or an inorganic source, such as a metal hydride. An unsaturated hydrocarbon, such as an olefin is a hydrogen source in particular embodiments.

Particular methods are detailed in which high kinetic energy milling includes ball milling.

A coal included in a composition in particular embodiments is selected from the group consisting of anthracite, lignite, bituminous, sub-bituminous and a combination of these.

Further provided is an embodiment of an inventive method including adding energy to a produced crystalline carbon to produce a bucky diamond. Energy is added by a process illustratively including heating, irradiating and a combination of these or other energy addition methods.

A process for synthesizing a diamond-like carbon is provided including subjecting a composition including coal to high kinetic energy milling under system reaction conditions, producing a milled product. The milled product is exposed to an acid, a base, or a combination thereof, thereby synthesizing a diamond-like carbon.

In further embodiments, a process for synthesizing a nanocrystalline diamond is provided which includes subjecting a composition comprising coal to high kinetic energy milling under system reaction conditions, producing a milled product and thermally treating the milled product to produce a thermally treated milled product. The thermally treated milled product is exposed to an acid, a base, or a combination thereof, thereby synthesizing a nanocrystalline diamond.

Specific embodiments of methods of synthesizing a nanocrystalline diamond and/or a diamond-like carbon include producing a milled product characterized by presence of tetrahedral amorphous carbon formed during milling.

In preferred embodiments, methods of synthesizing a nanocrystalline diamond and/or a diamond-like carbon include producing a milled product characterized by presence of hydrogenated tetrahedral amorphous carbon formed during milling. A hydrogenated tetrahedral amorphous carbon is formed during milling of a carbon source, such as a carbonaceous material, and a hydrogen source in particular embodiments.

In further embodiments of methods according to the present invention, a thermally treated milled product is characterized by presence of a metal carbide formed during thermal treatment. A thermally treated milled product exposed to an acid, a base, or a combination thereof is characterized by extraction of a metal from a metal carbide formed during thermal treatment in particular inventive methods.

A composition is provided which includes a synthetic crystalline carbon material characterized by a face centered cubic structure, zone axis [111] having a $d_{111}$ spacing of about 1.99+0.2. Addition of energy to this material converts at least a portion of the material to a bucky diamond. The synthetic crystalline carbon material thus is a precursor to bucky diamond. Methods of producing a bucky diamond including addition of energy to a synthetic crystalline carbon material characterized by a face centered cubic structure, zone axis [111] having a d111 spacing of about 1.99+0.2 are thus provided according to embodiments of the present invention.

BRIEF DESCRIPTION OF THE DRAWINGS

FIG. 4A shows an HR-TEM image of material, processed by an inventive method including both thermal treatment and purification, including a nanocrystalline diamond particle;

FIG. 4B shows an HR-TEM image of material, processed by an inventive method including both thermal treatment and purification, including a nanocrystalline diamond particle;

FIG. 4C shows an HR-TEM image of material, processed by an inventive method including both thermal treatment and purification, illustrating that thin regions also have the characteristic structure of diamond;

FIG. 4D shows an HR-TEM image of material, processed by an inventive method including both thermal treatment and purification, illustrating metals and metal carbides surrounded by amorphous material;

DETAILED DESCRIPTION OF THE PREFERRED EMBODIMENTS

Synthetic diamond, and particularly synthetic diamond that is less than 1 mm in diameter, is used for grinding and polishing due to the high strength of diamond. NCD is used in high-precision polishing applications and, when combined with polymers, as surface coatings for aircrafts, cars, and ships. NCD is used in the electronics industry: as an additive to magnetic recording systems to reduce friction and increase the wear resistance of the magnetic materials, in field electron emission materials (i.e. flat panel displays), in nanoelectromechanical resonant structures (NEMS), and in biosensors, for example.

Methods and compositions for producing diamond materials are provided according to the present invention. A diamond material produced according to an inventive process includes diamond, particularly nanocrystalline diamond, bucky diamond and/or a "diamond-like carbon." Diamond-like carbon is a metastable carbon which includes a variety of carbon structures and compositions. Diamond-like-carbon (DLC) includes $sp^3$ and $sp^2$ carbon structures, where $sp^2$-bonded graphite-like clusters are embedded in an amorphous $sp^3$-bonded carbon matrix. Diamond-like carbon may include regions of crystallinity, including regions of crystallinity in the form of nanocrystalline diamond and/or bucky diamond. It is not intended that the term diamond-like carbon to be limited to thin coatings, as it is sometimes, but not exclusively, used in the literature.

Nanocrystalline diamond refers to a diamond material having a region of $sp^3$-bonded crystallinity having a size in the range of about 1 nm-about 1 micron, inclusive.

Further description of diamond-like carbon and crystalline carbon structures is provided in Pierson, H. O. (1993), "Handbook of Carbon, Graphite, Diamond and Fullerenes—Properties, Processing and Applications", William Andrew Publishing/Noyes; and in Pure & Appl. Chem., Vol. 67, No. 3, pp. 473-506, 1995.

Figure 1A:
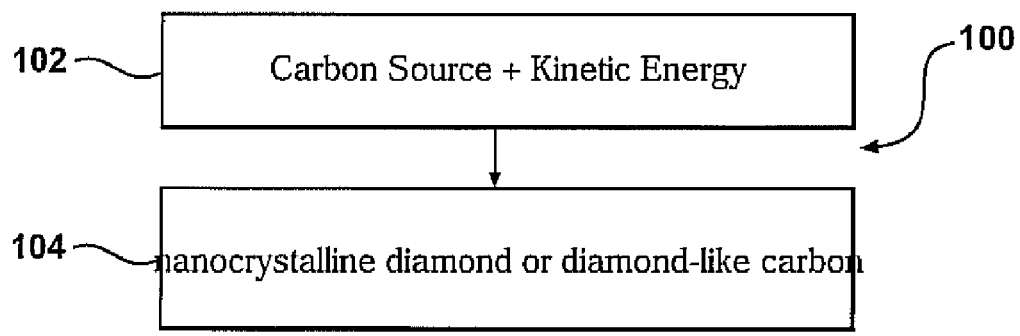
FIG. 1A is a block diagram illustrating a method of crystalline carbon synthesis according to the present invention.

FIG. 1A illustrates a process according to embodiments of the present invention 100 including adding kinetic energy to a composition including a carbon source 102 to produce a nanocrystalline diamond or crystalline diamond-like carbon 104.

Figure 1B:
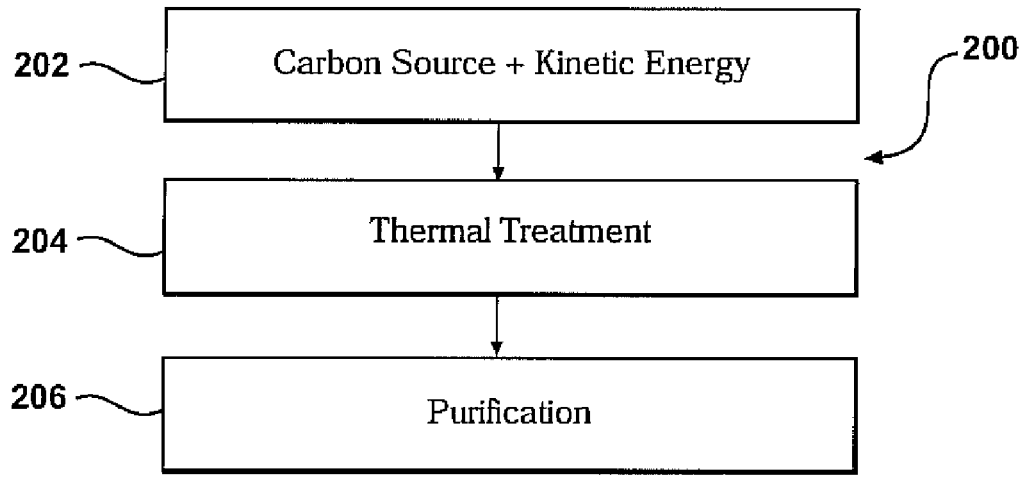
FIG. 1B is a block diagram illustrating a method of crystalline carbon synthesis according to the present invention.

FIG. 1B illustrates a process according to embodiments of the present invention 200 including adding kinetic energy to a composition including a carbon source 202, exposing the produced material to thermal treatment 204 and exposing the thermally treated material to acid and/or base treatment 206 to produce a nanocrystalline diamond.

Figure 1C:
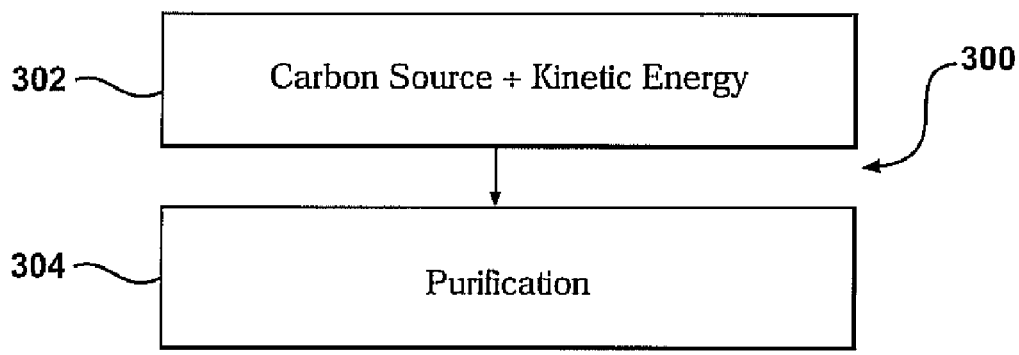
FIG. 1C is a block diagram illustrating a method of crystalline carbon synthesis according to the present invention.

FIG. 1C illustrates a process according to embodiments of the present invention 300 including adding kinetic energy to a composition including a carbon source 302 and exposing the thermally treated material to acid and/or base treatment 304 to produce a crystalline diamond-like carbon.

A process for malting a diamond material is provided according to particular embodiments which includes subjecting a composition containing a carbon source to high kinetic energy process, such as high kinetic energy milling. In further particular embodiments a process for making a diamond material is provided which includes subjecting a composition containing a carbon source and a hydrogen source to high kinetic energy process, producing a hydrogenated carbon material, particularly a hydrogenated tetrahedral amorphous diamond-like carbon material.

A process for making a diamond material is provided according to specific embodiments which includes subjecting a composition containing a carbonaceous material to high kinetic energy process, such as high kinetic energy milling.

In particular embodiments, a composition subjected to high energy kinetic milling including a carbonaceous material further includes a hydrocarbon. A carbonaceous material may further include a transition metal, an alkaline earth metal, an alkali metal, a non-metal, or a combination of two or more of these. A composition subjected to high energy kinetic milling including a carbonaceous material optionally includes a hydrogen source.

Optionally, a metal is present a composition subjected to high energy kinetic milling. A metal is added in particular embodiments. In addition, a metal may be present in a composition subjected to milling due to extraction from a ball mill apparatus. Iron is present or added as elemental iron and/or an iron compound. In particular embodiments, elemental iron and/or an iron oxide is added to a composition subjected to high energy kinetic milling.

A process for synthesizing a nanocrystalline diamond or diamond-like carbon is provided including subjecting a composition including coal to high kinetic energy milling under system reaction conditions, producing a milled product. In particular embodiments the milled product is enriched in tetrahedral amorphous diamond-like carbon compared to the coal. In further particular embodiments the milled product is enriched in hydrogenated tetrahedral amorphous diamond-like carbon compared to the coal.

Optionally, a process for synthesizing a nanocrystalline diamond or diamond-like carbon further includes treating the milled product with a treatment selected from the group consisting of: heating, exposure to an acid, exposure to a base, and a combination thereof.

In certain embodiments, system reaction conditions include a system pressure in the range of 0.1-50 atm. In preferred embodiments, system reaction conditions include a system pressure in the range of 0.9-10 atm. In addition, system reaction conditions may include a system temperature in the range of 0-100° C. in particular embodiments. In preferred embodiments, the system reaction conditions include a system temperature in the range of 10-40° C. In general, a system includes a reactor and reactants. A moderate temperature for reaction conditions in a reaction system is in the range of about 0-100° C., inclusive and a moderate pressure is in the range of about 0-10 atm, inclusive. In further embodiments, a moderate temperature for reaction conditions in a reaction system is in the range of about 10-40° C., inclusive.

In particular embodiments, no heat is added to a reaction system, such as a reactor and reactants. It is appreciated that addition of kinetic energy to a reaction system may increase the temperature of the reaction system due to friction, for instance. Thus, the reaction system temperature in a system run with no added heat may be elevated above room temperature due to such friction and/or other operational and/or reaction sources. However, friction and/or other operational and/or reaction sources do not result in reaction conditions appreciably over 100° C.

Optionally, the composition further includes a hydrogen source in particular embodiments. A hydrogen source is illustratively an organic source such as a hydrocarbon and/or an inorganic source, such as a metal hydride. An unsaturated hydrocarbon, such as an olefin is a hydrogen source in particular embodiments.

Particular methods are detailed in which high kinetic energy milling includes ball milling.

A coal included in a composition in particular embodiments is selected from the group consisting of anthracite, lignite, bituminous, sub-bituminous and a combination of these.

A process for synthesizing a diamond-like carbon is provided including subjecting a composition including coal to high kinetic energy milling under system reaction conditions, producing a milled product. The milled product is exposed to an acid, a base, or a combination thereof, thereby synthesizing a diamond-like carbon.

In further embodiments, a process for synthesizing a nanocrystalline diamond is provided which includes subjecting a composition comprising coal to high kinetic energy milling under system reaction conditions, producing a milled product and thermally treating the milled product to produce a thermally treated milled product. The thermally treated milled product is exposed to an acid, a base, or a combination thereof, thereby synthesizing a nanocrystalline diamond.

Specific embodiments of methods of synthesizing a diamond material include production of a carbon-based product characterized by presence of tetrahedral amorphous carbon, particularly hydrogentated tetrahedral amorphous carbon formed during addition of energy to a carbon source.

Further specific embodiments of methods of synthesizing a diamond material include production of a carbon-based product characterized by enrichment in a metal compared to the carbon source.

Specific embodiments of methods of synthesizing a nanocrystalline diamond and/or a diamond-like carbon include production of a milled product characterized by presence of tetrahedral amorphous carbon formed during milling.

Additional embodiments of methods of synthesizing a nanocrystalline diamond and/or a diamond-like carbon include production of a milled product characterized by presence of a metal. In particular embodiments, iron is present in a product of high energy kinetic milling of a carbon source in amounts in the range of 1-40%, typically 10-20% of the total weight of the milled product.

In further embodiments of methods according to the present invention, a thermally treated milled product is characterized by presence of a metal carbide formed during thermal treatment. A thermally treated milled product exposed to an acid, a base, or a combination thereof, is characterized by extraction of a metal from a metal carbide formed during thermal treatment in particular inventive methods.

A diamond material generated by embodiments of a process according to the present invention has a particle size in the range between about 1 nanometer and 10 millimeters. In a preferred embodiment, the diamond material includes a nanocrystalline diamond and/or a diamond-like carbon having a particle size in the range between about 0.5 nanometer and 1 micrometer. Also preferably, the diamond material includes a nanocrystalline diamond and/or a diamond-like carbon having a particle size in the range between about 0.75 nanometer and 75 nanometers. Further preferred the diamond material includes a nanocrystalline diamond and/or a diamond-like carbon having a particle size in the range between about 1 nanometer and 50 nanometers.

Methods according to the present invention are provided for synthesizing a bucky diamond in particular embodiments. In particular, a diamond-like carbon produced according to embodiments of the present invention is a precursor material to a bucky diamond. Energy is added to the precursor material to induce formation of a bucky diamond. The term "Buckydiamond" is intended to mean a nanocrystalline diamond surrounded by a carbon shell that is highly graphitic in nature, or a nanocrystalline diamond particle surrounded by graphitic 'onions'.

A composition is provided which includes a synthetic crystalline carbon material characterized by a face centered cubic structure, zone axis [111] having a $d_{111}$ spacing of about 1.99+0.2. Addition of energy to this material converts at least a portion of the material to a bucky diamond. The synthetic crystalline carbon material thus is a precursor to bucky diamond.

Further provided is an embodiment of an inventive method including adding energy to a produced crystalline carbon to produce a bucky diamond. Energy is added by a process illustratively including heating, irradiation and a combination of these or other energy addition methods. Irradiation illustratively includes microwave irradiation and laser irradiation.

Methods of producing a bucky diamond including addition of energy to a synthetic crystalline carbon material characterized by a face centered cubic structure, zone axis [111] having a $d_{111}$ spacing of about 1.99+0.2 are provided according to embodiments of the present invention Energy is added in a process for producing a diamond material according to embodiments of the present invention. Energy is optionally added as heat and/or kinetic energy for example. Addition of kinetic energy may be by high kinetic energy milling in particular embodiments.

High kinetic energy milling used in an inventive process preferably includes ball milling. Other types of high energy milling which may be used include rod milling and hammer milling, for instance.

The term "carbon source" as used herein refers to a material including carbon in a form capable of forming a diamond-like carbon structure when combined with energy, particularly kinetic energy. A preferred carbon source in particular embodiments includes an acene. Acenes illustratively include compounds having the general formula $C_{2x-6}H_x$. Specific examples of acenes include naphthalene, anthracene, tetracene, pentacene hexacene, heptacene and octacene. A larger carbon structure including an acene is a carbon source. For example, in an amorphous and/or crystalline carbonaceous material such as anthracite may include an acene.

A carbon source is optionally used in solid form to produce a material including a tetrahedral amorphous diamond-lice carbon in embodiments of the present invention. Alternatively or in addition, a liquid carbon source is optionally used. For example, petroleum is an example of a liquid carbon source.

A suitable carbonaceous material may include an amorphous carbonaceous material and/or a crystalline carbonaceous material. The term "carbonaceous material" as used herein is intended to refer to a material enriched in amorphous carbon and/or crystalline carbon. In one preferred embodiment, such a material is substantially solid under conditions used in an inventive process. In further preferred embodiments, a carbonaceous material is a material containing 30-100% by weight carbon in an amorphous and/or crystalline form. Further preferred are carbonaceous materials which contain at least 50% by weight carbon in an amorphous and/or crystalline form. Still further preferred are carbonaceous materials which contain at least 75% by weight carbon in an amorphous and/or crystalline form. In some preferred embodiments, carbonaceous materials which contain at least 90% by weight carbon in an amorphous and/or crystalline form.

An illustrative amorphous carbonaceous material is coal. Examples of coals which may be used include anthracite, lignite, bituminous, sub-bituminous, waste coal, and a combination of two or more of these. An exemplary crystalline carbonaceous material includes graphite. Another example of a suitable coal includes a coal containing both amorphous carbon and a crystalline carbon. It will be appreciated by those of skill in the art that coal includes carbon along with other materials such as inherent mineral matter. Hydrogen is also present in some coals.

Further exemplary carbonaceous materials include waste biomass.

A metal, such as a transition metal, an alkaline earth metal, an alkali metal, or a combination thereof is optionally added, extracted from a reaction apparatus, such as high energy kinetic mill, by operation and/or is included in a carbon source and/or hydrogen source included in a composition including a carbon source to which energy is added to produce a diamond material. A preferred metal is iron.

The composition used in a process of making a diamond material according to the present invention optionally includes a carbonaceous material which contains a second material in addition to amorphous and/or crystalline carbon. Such a second material may be a hydrocarbon, a transition metal, an alkaline earth metal, an alkali metal, a non-metal, or a combination thereof in one example. Thus, for instance, coal containing amorphous carbon, and optionally, one or more hydrocarbons and/or one or more metals may be used as a composition to be subjected to high kinetic energy milling.

In a further embodiment, the composition including a carbonaceous material is formed by creating a mixture including the carbonaceous material and an exogenous second material.

In an embodiment in which a carbonaceous material and a hydrocarbon are included in a composition to be subjected to a high kinetic energy process, the ratio of carbon to hydrocarbon is in the range of about 1000:1-1:1000 on a weight/weight basis.

A hydrocarbon included in a composition may be a saturated or unsaturated hydrocarbon, such as a substituted or unsubstituted, linear, cyclic or branched alkane, alkene or alkyne. In a further example, a suitable hydrocarbon includes an olefin. A particular class of olefins which may be used in one embodiment of an inventive process includes acenes.

In an embodiment in which a carbonaceous material and a metal are included in a composition to be subjected to a high kinetic energy process, the ratio of carbon to metal is in the range of about $10^6:1\text{-}10^2:1$.

In further embodiments of an inventive process, a hydrogen source is present in the composition subjected to high energy kinetic milling. For example, an illustrative suitable hydrogen source is a hydrocarbon such as described above.

In a further embodiment, a hydrogen source may be an inorganic hydrogen-containing material. An example of an inorganic hydrogen-containing material is a metal hydride.

Another example of an inorganic hydrogen-containing material is ammonia and ammoniated compounds.

In particular embodiments, a hydrogen source may be a gas, such as hydrogen gas.

In general, a composition including a carbonaceous material is subjected to a high energy kinetic process under system conditions characterized by moderate temperature and moderate pressure conditions. For instance, such system reaction conditions may include a pressure in the range of 0-50 atm, or more preferably, a pressure in the range of 0.9-10 atm. System reaction conditions may also include a temperature in the range of 0-550° C., or more preferably, in the range of 0-100° C. In a further preferred embodiment, system reaction conditions are in the room temperature range.

In one embodiment, a process for making a diamond material is provided which includes subjecting a composition including a carbonaceous material and an optional wetting agent to a high kinetic energy process, thereby forming a diamond material. A wetting agent included in an inventive process may have various functions. A wetting agent may, for instance, aid in producing a diamond material by decreasing surface tension between particles, thus decreasing aggregates. Further, a wetting agent may serve as a lubricant and/or interfacial transfer medium. In certain embodiments, a wetting agent includes a chemical reactant or catalyst in a reaction for forming a diamond material. In addition, a wetting agent may include a hydrogen donor in a reaction for forming a diamond material. Optionally, a wetting agent includes a non-solid in a preferred embodiment using the high kinetic energy process. An exemplary wetting agent is a hydrocarbon, such as cyclohexene. In general, a preferred wetting agent is non-combustible under conditions used in an inventive process.

Optionally, a milled product obtained by a process according to the present invention is subjected to purification. The term "purification" as used in the context of treating a milled product herein is intended to refer to treatment of a milled product, particularly a milled product including an amorphous tetrahedral diamond-like carbon resulting in production of a diamond material and particularly crystalline carbons, nanocrystalline diamond and/or diamond-like carbons, according to the present invention. Further preferred is "purification" of a milled product including a hydrogenated tetrahedral amorphous diamond-like carbon.

An exemplary purification is by thermal treatment, also referred to herein as thermal anneal. A thermal anneal is performed by exposing a milling product to heat for a period of time. For example, a hydrogenated carbon material may be treated by thermal anneal following synthesis such as thermal anneal at 1400° C. for 3 h under 1 L/min of argon. Further exemplary temperatures for thermal anneal are in the range of about 40° C.-3000° C., inclusive, although thermal anneal is not limited to temperatures in this range. The time and temperature as well as other parameters of the thermal anneal may be varied to produce nanocrystalline diamond and/or a diamond-like carbon according to particular embodiments of a method of the present invention.

In certain embodiments a thermal anneal treatment is performed following exposure of a milled product to an acid and/or base.

In particular embodiments, a thermally treated milled product is enriched in a metal carbide compared to a milled product not subjected to thermal treatment. For example, a thermally treated milled product is enriched in an iron carbide in specific embodiments. Further examples of metal carbides enriched in a thermally treated milled product illustratively include a nickel carbide, a silicon carbide, a chromium carbide and mixtures of these and/or other metal carbide.

Further exemplary "purification" includes treatment of a milled product and/or a thermally treated milled product with strong acid and/or base. Exposure to acid and/or base may be followed by washing. For example, purification may include treatment with 4 M HCl for 24 h at room temperature following by extensive washing with deionized water, and 10 M NaOH treatment for 24 h at room temperature followed by extensive washing with deionized water. The recited times of such treatments as well as the recited identity and concentrations of ingredients of a purifying treatment are exemplary. In general, an acid or base at a concentration in the range of about 0.1-67%, inclusive may be used in purification, for times ranging from about 1 hour to about 10 days. Acids and bases other than HCl and NaOH may also be used.

Exposure of a milled product and/or a thermally treated milled product to an acid and/or base is optionally performed by first exposing the product to an acid or first exposing the product to a base.

Optionally, a milled product and/or a thermally treated milled product is exposed to more than one acid and/or more than one base, sequentially or simultaneously. In a further option, a milled product and/or a thermally treated milled product is exposed to a particular acid or base more than once.

Exposure of a milled product and/or a thermally treated milled product to an acid and/or base is achieved by various methods including partial or total immersion in an acid and/or base liquid, gas, vapor or other form.

In particular embodiments, the identity of the acid and/or base, the concentration of the acid and/or base, and/or the time of exposure of a milling product and/or a thermally treated milled product to an acid and/or base is selected to achieve extraction of a metal from a milling product and/or a thermally treated milled product. In specific embodiments an acid and/or base treatment extract a metal from a metal carbide present in the milling product and/or a thermally treated milled product. In further embodiments, an acid and/or base treatment is performed to extract iron from a milled product and/or a thermally treated milled product.

Thermally treated, acid treated and/or base treated material including a nanocrystalline diamond, crystalline diamond-like carbon and/or bucky diamond is optionally further processed in particular embodiments to separate the nanocrystalline diamond, crystalline diamond-like carbon and/or bucky diamond from undesired non-carbon material and/or carbon in other forms. Such separation procedures illustratively include separation based on differential hardness, particle size, oxidation and dissolution characteristics.

Embodiments of inventive compositions and methods are illustrated in examples herein. These examples are provided for illustrative purposes and are not considered limitations on the scope of inventive compositions and methods.

EXAMPLES

Example 1

The coal used is Buck Mountain PSOC-1468, (abbreviated as 'BMT' henceforth) from the Penn State University coal sample bank. BMT is an anthracite coal from the bottom of the Llewellyn formation the Buck Mountain Seam, collected from Luzerne Co., PA. BMT has a low volatile matter content (3.65 wt %, dry) and high fixed carbon content (89.52 wt %, dry). The ash content of the coal precursor is relatively low for a naturally occurring coal (6.6%), consisting primarily of naturally occurring minerals. Neutron activation analysis (NAA) of the coal precursor indicated traces of Aluminum, Antimony, Arsenic, Barium, Bromine, Cerium, Chromium, Hafnium, Iron, Lanthanum, Magnesium, Potassium, Scandium and Tungsten. The amount of silicon present in the coal precursor is not currently known, as differentiation between Al and Si is difficult via NAA. BMT coal is used 'as received' without prior demineralization. BMT is screened to −60 mesh prior to use, in agreement with the volumetric distribution of particle size, ranging from 0.2-480 microns.

A Fritsch Pulveristte LC-106A with stainless steel components (316 SS) is used to ball mill the samples at 400 rpm. The ball mill is 110 V single phase alternating voltage with a maximum current rating of 10 amp, and has a maximum power consumption of 1 kW. By coal is ball milled for 1, 5, 10, 20, 80 and 160 hours to establish the effect of milling time, both with and without a cyclohexene (J T Baker, 99%) wetting agent added at a 3.3 milliliter per gram of coal ratio. In further examples, a ratio of cyclohexene to coal of 8.25 is used. The BMT coal samples are milled in cyclohexene for 80 hours based on these studies. All milling occurred under a 1 bar argon atmosphere to minimize oxidation effects and water contamination during processing. The entire milling process is conducted intermittently (10 minutes on followed by 5 minutes off) to minimize heating effects during milling. Select samples milled for 80 hours are selected for a subsequent thermal anneal at 1400° C. for 3 h under 1 L/min of argon to graphitize the materials. Select samples are purified using: 4 M HCl for 24 h at room temperature, extensive washing with deionized water, a 10 M NaOH treatment for 24 h at room temperature, then extensive washing with deionized water. Sample notation is as follows: BMT refers to the Buck Mountain coal, and "80CH" refers to ball milling for 80 hours in cyclohexene. Where a number follows the notation "80CH", the number refers to the temperature of thermal anneal in ° C., and "—HCl" or "—NaOH" denote subsequent treatments with HCl or NaOH. Thus, BMT-80CH-1400 refers to Buck Mountain coal ball milled for 80 hours in cyclohexene, the product of ball milling subsequently subjected to thermal anneal at 1400° C. for 3 h under 1 L/min of argon. Similarly, BMT-80CH-1400-HCl refers to Buck Mountain coal ball milled for 80 hours in cyclohexene, the product of ball milling subsequently subjected to thermal anneal at 1400° C. for 3 h under 1 L/min of argon, the product of thermal anneal subsequently subjected to treatment with HCl. BMT-80CH-1400-HCl—NaOH refers to Buck Mountain coal ball milled for 80 hours in cyclohexene, the product of ball milling subsequently subjected to thermal anneal at 1400° C. for 3 h under 1 L/min of argon, the product of thermal anneal subsequently subjected to treatment with HCl and the product following HCl treatment further treated with NaOH.

Electron micrographs are obtained via high resolution transmission electron microscopy (HRTEM) on a JEOL 2010F at 200 kV. Energy-dispersive X-ray (EDX) spectra are taken on each region reported here to ensure the region is primarily carbon based. X-Ray Diffraction (XRD) measurements are taken with Rigaku Geiger Philips MPD operated with Cu K radiation operated at 30 kV and 50 mA. XRD data are generally normalized per the intensity of the peak at 26°; (BMT-80CH which had no peak at 26° is the exception to this). Raman spectroscopy is done on a Renishaw in Via spectrometer with a confocal Leica DM LM microscope and a Peltier cooled RenCam dd-CCD with a red (633 nm) HeNe laser. TPO is performed after each step in synthesis in a Perkin Elmer 7 thermogravimetric analyzer (TGA) by flowing UHP grade air with a flow rate of 100 cc/min. Samples (7-13 mg) are heated from 25° C. to 850° C. with a ramp rate of 5° C./min. TPO is plotted as the negative derivative weight, normalized per dry sample weight at 110° C.

Example 2

Figure 2:
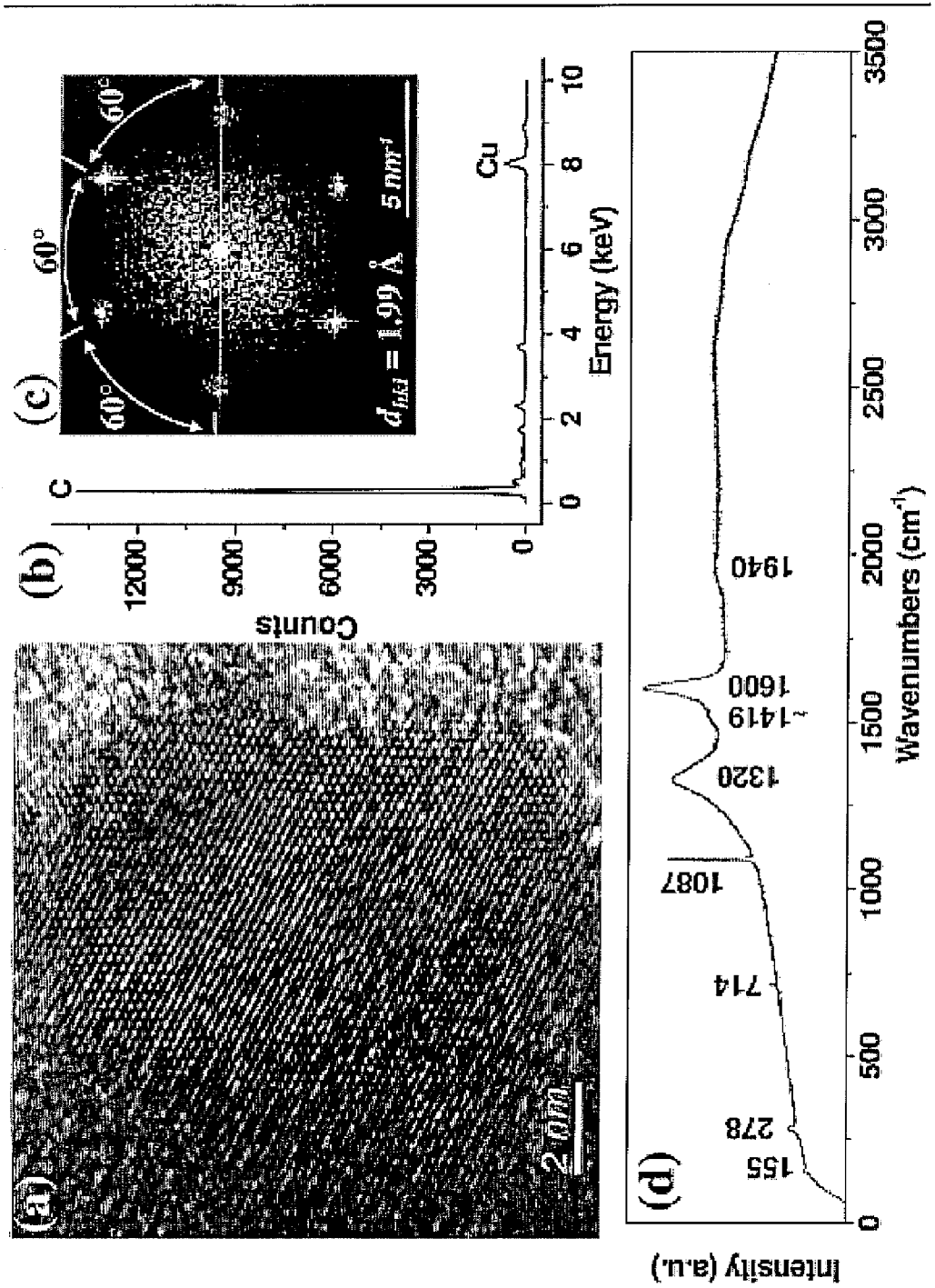
FIG. 2A is an image of an HR-TEM observation of crystalline carbon in BMT-80CH surrounded by amorphous carbon.
FIG. 2B shows EDX data indicating that the region shown in FIG. 2A is carbon based.
FIG. 2C shows Fourier transform of the image shown in FIG. 2A indicating that the image presents a six-fold symmetry corresponding to crystalline planes with a 1.99 Angstrom ($d_{hkl}$) spacing.
FIG. 2D shows visible Raman spectra of the sample shown in FIG. 2A indicating a broad D peak and several additional peaks relative to the BMT coal which is a precursor to the crystalline material.

A crystalline carbon structure embedded in amorphous carbon is observed via HRTEM in BMT-80CH—HCl—NaOH, FIG. 2A. The amorphous-carbon encapsulated structure converts to a bucky diamond structure with electron irradiation, indicating the instability of this region. The crystalline structure of BMT-80CH—HCl—NaOH is different than that of BMT-80CH-1400: the six-fold symmetry of the FT from BMT-80CH—HCl—NaOH, FIG. 2C correlates with either a face centered cubic structure, zone axis [111], or a close packed hexagonal structure, zone axis [0001]. The $d_{hkl}$ spacing of 1.99 Å does not match graphite, diamond, or lonsdaleite. EDX analysis indicates this region is primarily carbon-based, FIG. 2B. BMT-80CH—HCl—NaOH shows a sharp Raman peak at 1090 cm−1 and several low frequency peaks, e.g. 155, 278, 714 cm−1, as shown in FIG. 2D.

Example 3

Figure 3:
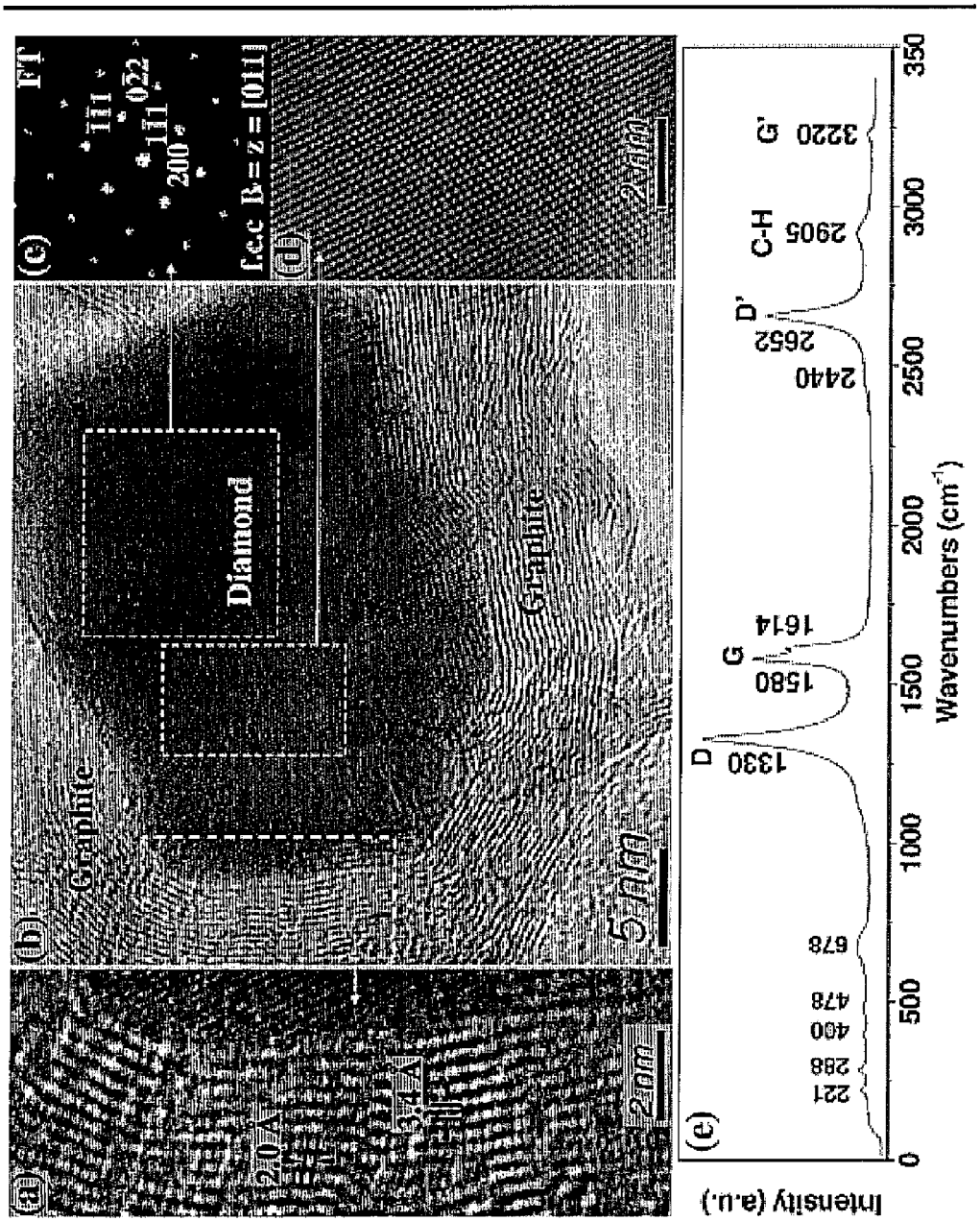
FIG. 3A shows an image of a representative HR-TEM of a crystalline region.
FIG. 3B shows an image of a representative HR-TEM of a crystalline region.
FIG. 3C shows shows Fourier transform indicating a highly crystalline structure with a 3.56 Angstrom lattice parameter.
FIG. 3D shows a high resolution micrograph indicating a highly crystalline structure with a 3.56 Angstrom lattice parameter.
FIG. 3E shows visible Raman, 633 nm, results showing a split G peak, 1580 and 1614, an increased D' peak, 2652, and several low frequency peaks.

In this example, BMT-80CH is heated to 1400° C. in argon, then subjected to a series of acid and base treatments to produce BMT-80 CH-1400-HCl—NaOH. Crystalline regions are observed at several locations in BMT-80CH-1400, ranging in size from 5 to 35 nm. The crystalline regions are embedded in a graphitic carbon outer-layer, FIG. 3B, and Fourier transform (FT) reveals a reciprocal-space lattice corresponding to the diamond crystal structure observed along the [011] zone axis and a lattice constant of 3.57 Å (FIGS. 3C and 3D). The 3.4 Å spacing of the shells surrounding the core are consistent with graphite, but discontinuities with periodicity of 2.0 Å (close to the (111) interplanar distance of diamond) suggest a $sp^2$-$sp^3$ hybridization transition. These diamond-graphite structures are referred to as bucky diamond. Transition regions similar to FIG. 3A are also observed that lack the inner core structure. Corresponding changes in the visible Raman spectra, 633 nm, FIG. 3E may be attributed to structural doping, increased D' reflection at 2652 $cm^{-1}$, and localized $sp^2$ defects within $sp^3$ hybridized carbon, the so-called "dumbbell defect", at 1620 $cm^{-1}$. Low frequency Raman modes arise that are consistent with either metal oxides or carbon: NCD has been reported to have a vibration at 496 $cm^{-1}$ and tetrahedral carbon has a low energy tail at ~600 $cm^{-1}$ in visible excitation, Zhang, D. J. et al., J Phys Chem B, 2005, 109:9006; Bacsa, W. S. et al., J. Phys. Rev. B, 1993, 47:10931; and Ferrari A C, Robertson J., Phys Rev B 2001, 64:075414.

Example 4

A product of ball milling a carbon source and a hydrogen source, such as BMT-80CH, includes a hydrogenated tetrahedral amorphous carbon in embodiments of the present invention. BMT-80CH has photoluminescence in visible, 633 nm, Raman relative to the BMT coal which precursor to carbon structures synthesized by inventive methods. The photoluminescence continues in excess of one year after preparation, with decreased intensity. Photoluminescence has been empirically correlated to hydrogen content of hydrogenated tetrahedral amorphous carbons. Unusual high frequency Raman vibrations are observed for BMT-80CH: In freshly prepared samples, the photoluminescence obscures these high frequency peaks. One year after preparation, high frequency peaks are no longer obscured by photoluminescence and peaks at observed at 4125, 4166, and 4377 cm$^{-1}$. The high frequency peaks are near the Q-branch vibrations of molecular hydrogen, i.e. 4150-4160 cm$^{-1}$, which may be perturbed upon surface interaction, as demonstrated for in situ Raman hydrogen adsorption studies with carbon at cryogenic temperatures in a pressurized hydrogen atmosphere. Peaks in this range are not believed to be associated with carbon and the degree of photoluminescence is unusual.

Example 5

Embodiments of Methods According to the Present Invention Including Ball Milling, Thermal Annealing, and Acid-Treatment and/or Base Treatment of Materials.

Ball milling leads to amorphitization, increased carbon reactivity, and the introduction of transition metals. Thermal annealing forms metal carbides (primarily iron carbide) and graphitic regions, with graphitic ribbons as the prevalent carbon form observed in TEM. There is a strong interaction between metals and carbon after thermal annealing, as indicated by a prominent $G_2$ and 2D reflection in Raman. The purification sequence, consisting of 4M HCl and 10N NaOH treatment led to structural changes in the carbon material. The latter led to formation of metal oxides from oxidation of metal carbides, this reaction led to either $CO_2$ evolution or precipitation of a solid carbon form. Conclusive evidence for bucky diamond is found from TEM analysis of the NaOH treated sample. NCD content is too low to be detected by visible Raman and iron carbides interfere in XRD analysis.

TEM Analysis of Materials Processed by an Embodiment of a Method According to the Present Invention Including Ball Milling, Thermal Annealing, and Acid-Treatment and/or Base Treatment of Materials.

NCD particles are observed in TEM images of BMT samples processed by ball milling in cyclohexene, thermal anneal treatment, acid treatment and base treatment, BMT-80CH-1400-HCl—NaOH. The observed NCD particles are all encapsulated in a graphitic carbon outer-layer. HRTEM and Fourier Transform (FT) of the HRTEM images are shown in FIG. 3A-D. Additional structures observed in samples processed by ball milling in cyclohexene, thermal anneal treatment, acid treatment and base treatment, are shown in FIGS. 4A and 4B with particle sizes ranging from approximately 5 to 35 nm. The high contrast of these images indicates the NCD particles have an equal dimension parallel to the electron beam, and are thus approximately spherical. This type of carbon structure, with an sp$^3$ hybridized carbon core surrounded by a sp$^2$ hybridized fullerene-like coating is referred to as bucky diamond, Raty J Y, et al., Phys Rev Lett, 2003; 90(3):037401. The lattice spacing shown in these HRTEM images is characteristic of diamond, 2.0 Angstroms, and EDX of these regions is performed to confirm the materials are primarily carbon-based. The reciprocal-space lattice corresponds to the diamond crystal structure with the 3.57 Å lattice constant. Additional thin regions, evidenced by low contrast via TEM) of NCD regions are also observed in this material, FIG. 4C, as well as regions containing metals and metal carbides, FIG. 4D. EDX is used to differentiate NCD regions from metals. No graphite-encapsulated metals are observed in TEM, although some metals appeared surrounded by amorphous carbon, e.g. FIG. 4D.

Figures 5A, 5B, 5C, 5D, 5E:
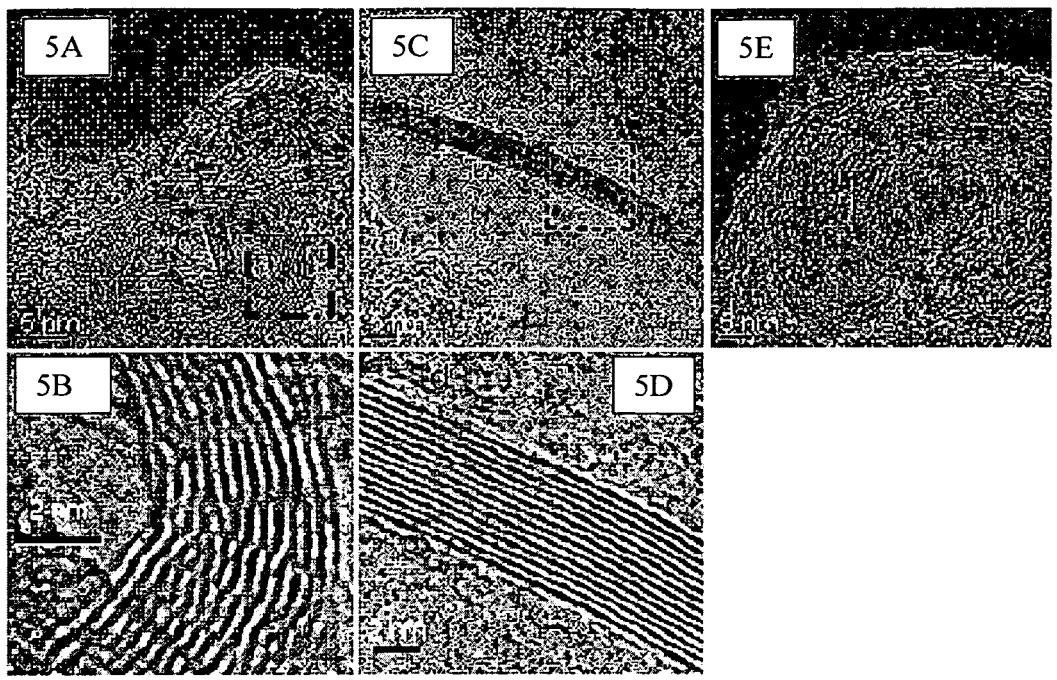
FIG. 5A shows an HR-TEM image of material, processed by an inventive method including thermal treatment without subsequent purification, illustrating graphitic regions and without nanocrystalline diamond.
FIG. 5B shows an HR-TEM image of material, processed by an inventive method including thermal treatment without subsequent purification, illustrating graphitic regions and without nanocrystalline diamond.
FIG. 5C shows an HR-TEM image of material, processed by an inventive method including thermal treatment without subsequent purification, illustrating graphitic regions and without nanocrystalline diamond.
FIG. 5D shows an HR-TEM image of material, processed by an inventive method including thermal treatment without subsequent purification, illustrating graphitic regions and without nanocrystalline diamond.
FIG. 5E shows an HR-TEM image of material, processed by an inventive method including thermal treatment without subsequent purification, illustrating graphitic regions and without nanocrystalline diamond and spiral-like regions emanating from a central core are illustrated.

Only amorphous carbon is observed via TEM in sample BMT-80CH, which is directly after ball milling. After a 1400° C. thermal anneal, graphitic ribbons are observed in BMT-80CH-1400, FIGS. 5A-5E. The graphitic ribbons are embedded in regions of amorphous carbon, and are often circular in form, see, e.g. FIG. 5A. Graphitic ribbons are both defected in nature, FIG. 5B, and also highly graphitic, with well-defined graphene planes with spacing of 3.4 Angstroms, FIGS. 5C and 5D. No clear bucky diamond structures are observed in BMT-80CH-1400, however certain regions seem to indicate the beginning of the formation of a central core structure and graphitic ribbons emanating from the central core, e.g. FIG. 5E. TEM observations and EDX analysis of milled samples heated to 700° C. and 1000° C. indicated the formation of metals and metal carbides with heating.

XRD Analysis of Materials Processed by an Embodiment of a Method According to the Present Invention Including, Ball Milling, Thermal Annealing, and Acid-Treatment and/or Base Treatment of Materials.

Figure 6:
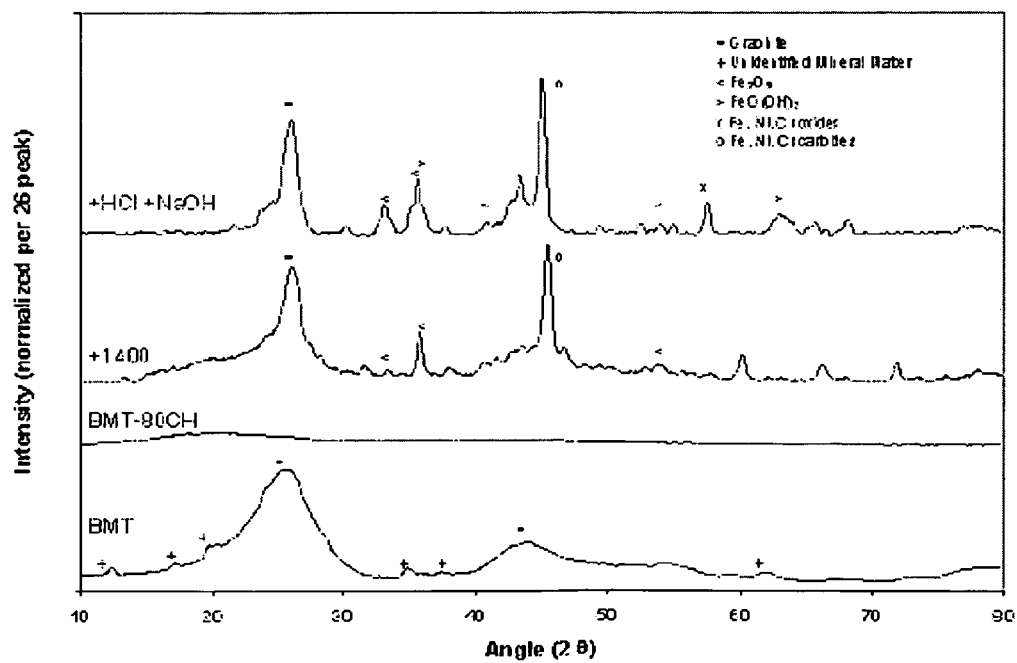
FIG. 6 is a graph including XRD analysis for BMT; BMT-80CH; BMT-80CH-1400, labeled +1400; and BMT-80CH-1400-HCl—NaOH, labeled "+HCl+NaOH"

XRD of each stage in a method according to an embodiment of the present invention including thermal anneal, acid treatment and base treatment, FIG. 6, is somewhat complicated from the natural mineral matter present in the coal and introduction of metals from attrition of the stainless steel mill. BMT shows XRD typical of anthracite coal, with a broad [002] peak (2θ=26°) and a two-dimensional carbon [10] peak (2θ=42-44°). Other peaks present in the BMT coal are due to mineral matter, as the BMT coal contains 6.7 wt % ash content. After milling, BMT-80CH is amorphous, evidenced by a lack of crystalline diffraction in XRD, particularly at 26° which would be expected for graphitic or quasi-graphitic materials. The 1400° C. thermal anneal leads to graphitization and the formation of metal carbides and metal oxides. The formation of $Fe_3C$ has been previously reported for graphite milled with stainless steel ball mills, Ichikawa T, et al., Mat Sci Eng B-Solid 2004; 108(1-2):138-42, yet iron carbides are more pronounced in XRD after the thermal anneal. The eutectic point of iron and carbon is 1130° C., Pollack H W. Materials Science and Metallurgy, 4th ed., Prentice-Hall 1988, supporting evidence for the formation of iron carbide after a thermal anneal to 1400° C. Additional metal oxide is present after NaOH treatment and the structure of the metal carbide peaks is altered. XRD does not provide conclusive evidence for diamond (at 2θ=43.89° and 75.4°) due to interferences with Fe-species expected to be present in the sample.

Raman Spectroscopy of Samples Processed According to an Embodiment of the Present Invention Including Thermal Anneal, Acid Treatment and Base Treatment.

Visible Raman spectroscopy of sp$^2$ hybridized carbons gives rise to characteristic D (defect) and G (graphite) peaks at 1350 cm$^{-1}$ and 1580 cm$^{-1}$, respectively, Tan P H, et al., Philos T Roy Soc A 2004; 362(1824):2289-310. The D and G peaks are broadened in amorphous carbon, Ferrari A C, Robertson J., Phys Rev B 2000; 61(20):14095-107. Diamond has a sharp D (diamond) peak at 1333 cm$^{-1}$, but sp$^3$-hybridized carbons such as diamond have a much smaller intensity (~$\frac{1}{50}^{th}$) in visible excitation compare to sp$^2$-hybridized carbons. Thus the presence of sp$^2$ carbons is expected to 'shield' the observation of any characteristic sp$^3$ peaks in a sample containing a mixture of the two types of carbon. The 'sp$^2$ shielding effect' is reduced, but still exists, with UV Raman. If the diamond content is less than ~25%, it will not be evident in UV Raman until graphite is removed by oxidation, Osswald S, et al., J Am Chem Soc 2006; 128(35):11635-42. Raman spectroscopy of iron carbides has been reported, Lee C T, et al., J Electrochem Soc 2006; 153(2):B33-B41; and Talyzin A V, Jansson U. A, Thin Solid Films 2003; 429(1-2): 96-101, but the assignment is inconsistent in the literature, perhaps due to complex spectra.

Figure 7:
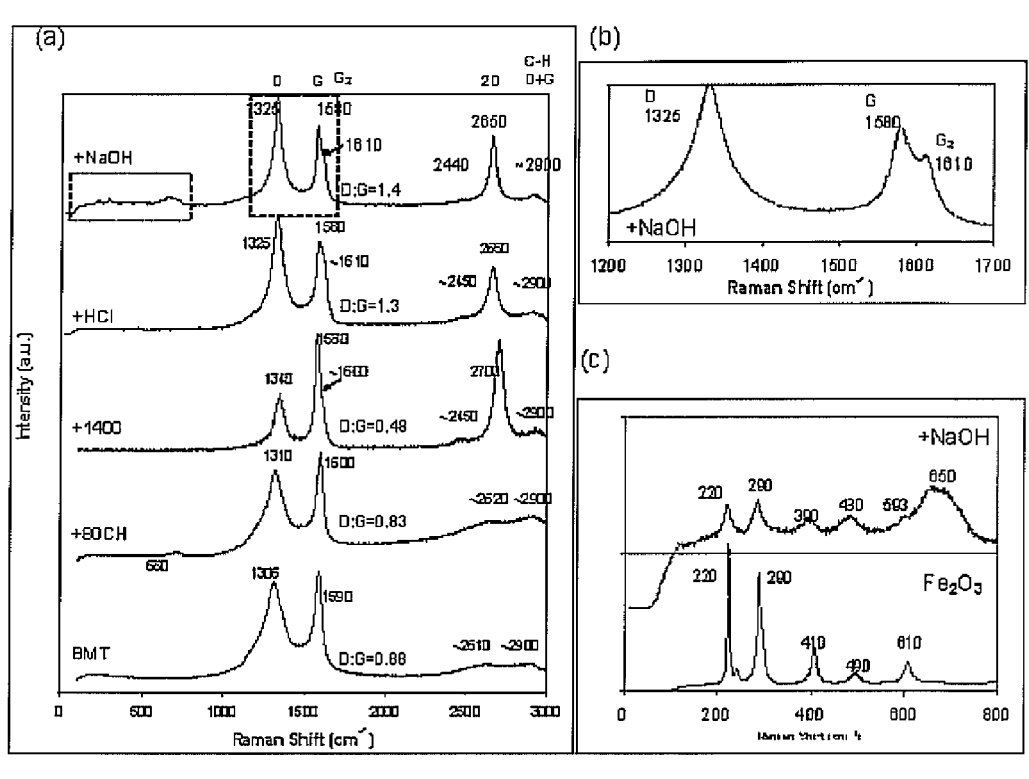
FIG. 7A shows Raman spectra for samples processed according to a method of the present invention including with and without ball milling, thermal treatment and various purification processes including BMT; BMT-80CH, labeled "+80CH"; BMT-80CH-1400, labeled +1400; BMT-80CH-1400-HCl, labeled "+HCl"; and BMT-80CH-1400-HCl—NaOH, labeled "+NaOH"
FIG. 7B shows an enlargement of the split G peak of BMT-80CH-1400-HCl—NaOH Raman spectra shown in FIG. 7A.
FIG. 7C shows a comparison between the low frequency Raman modes shown for BMT-80CH-1400-HCl—NaOH Raman spectra in FIG. 7A, "+NaOH" with those of $Fe_2O_3$.

Visible Raman spectra, 633 nm excitation, help to elucidate structural changes in a material processed by an embodiment of an inventive method, FIG. 7. The characteristic D and G peaks of BMT are quite broad. The D peak is both asymmetric and shifted compared to the expected frequency for $sp^2$-hybridized carbons (to 1306 cm$^{-1}$ rather than 1350 cm$^{-1}$). The frequency shift may suggest interaction of the carbon with metals, as shown for doped graphite, McGuire K, et al., Carbon 2005; 43(2):219-27. The asymmetry may arise due to the presence of metal oxides, which may also have Raman modes in this range. The D:G ratio of BMT is 0.88, indicative of a highly disordered carbon structure.

Ball milling leads to a decrease in the Raman D:G ratio (to 0.83), an increased slope of the background, and a small, broad Raman mode at ~680 cm$^{-1}$. The relationship between the slope, i.e photoluminescence of BMT-80CH and hydrogen content is discussed in Example 4 and is indicative of hydrogenated tetrahedral amorphous carbon in BMT-80CH. The peak at 680 cm$^{-1}$ may be due to the introduction of metals, metal carbides, Talyzin A V, Jansson U., Solid Films 2003; 429(1-2):96-101, metal oxides, and/or the formation of tetrahedral amorphous carbon which has a low energy tail in visible Raman at ~600 cm$^{-1}$, Bacsa W S, et al., Phys Rev B 1993; 47(16):10931-4; and Ferrari A C, Robertson J., Phys Rev B 2001; 64(7):075414. The latter is consistent with the hydrogen evolution seen from these samples. However, as metals and metal oxides are both expected to be present in this sample, the peak at 680 cm$^{-1}$ cannot be conclusively assigned.

The Raman spectrum of thermally annealed BMT-80CH-1400 indicates a decrease in the D:G ratio (to 0.48) which is consistent with graphitization of the sample. There is a significant increase of the 2D peak at 2650 cm$^{-1}$, yet this 2D peak is shifted relative to other reports at ~2700 cm$^{-1}$, Sato Y, et al., Carbon 1978; 16(4):279-80; and Dresselhaus M S, et al., Raman Scattering in Carbon Materials, In: Pelletier M J, ed. Analytical Applications of Raman Spectroscopy. Ann Arbor; Blackwell Science: 367-434. The shift in the 2D peak results from a shift in the primary D peak, which is observed even in the BMT precursor. A 2D peak of this magnitude has been associated with substitutional doping of graphite, and shifts in the 2D peak may reflect weakening bonds between the carbon and dopant, McGuire K, et al., Carbon 2005; 43(2):219-27. Thus, the Raman spectra of BMT-80CH-1400 is characteristic of a slightly ordered carbon material with strong interactions with metal dopants.

Treatment with 4 M HCl leads to transformation in the carbon structure, evidenced by an increase in the D:G ratio to 1.3, a decreased secondary 2D reflection, and an asymmetry in the G peak. The decreased 2D reflection suggests decreased interaction with metals. The 10 M NaOH treatment leads to several low frequency peaks, at 225, 292, 410, 496, 650 cm$^{-1}$; the match with $Fe_2O_3$ Raman, FIG. 7C, shows NaOH oxidation of Fe-species and formation of $Fe_2O_3$. The peak at 650 cm$^{-1}$ is much broader than the 680 cm$^{-1}$ peak seen for BMT-80CH. Once again, it cannot be conclusively assigned and may be due to metals, metal oxides, or tetrahedral amorphous carbon.

The asymmetry in the G peak of BMT-80CH-1400, BMT-80CH-1400-HCl, and most prominently, in BMT-80CH-1400HCl—NaOH can be resolved into two peaks at 1585 cm$^{-1}$ and 1610 cm$^{-3}$, shown for BMT-80CH-1400HCl—NaOH in FIG. 7B. The strength of the 1610 cm$^{-1}$ peak is highly unusual for $sp^2$ hybridized carbon, and possibly related to the strong intensity of the disordered 'D' peak at 1350 cm$^{-1}$, Dresselhaus M S, et al., Raman Scattering in Carbon Materials. In: Pelletier M J, ed. Analytical Applications of Raman Spectroscopy. Ann Arbor; Blackwell Science: 367-434. A similar peak, at 1620 cm$^{-1}$, has been observed after ball milling graphite in high pressure hydrogen, and attributed to $sp^2$-hybridized defects introduced during ball milling, Orimo S, et al., J Appl Phys 2001; 90(3):1545-9. As NCD is observed in TEM of BMT-80CH-1400-HCl—NaOH, we note that a peak at 1620 cm$^{-1}$ has been associated with NCD and assigned to a localized (100) $sp^2$ bonded pair of carbons within the diamond, the so-called "dumbbell defect", Prawer S, et al., Chem Phys Lett 2000; 332(1-2):93-7.

Temperature programmed oxidation (tpo) of material processed according to an embodiment of the present invention including thermal anneal, acid treatment and base treatment.

Figure 8:
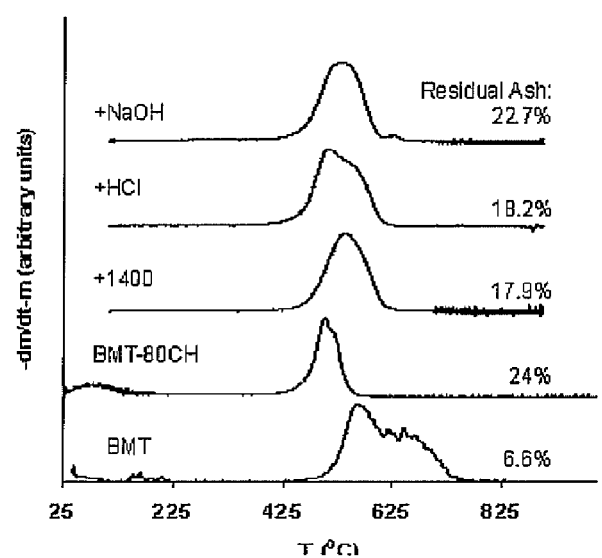
FIG. 8 shows results of temperature programmed oxidation of material processed according to methods of the present invention including with and without ball milling, thermal treatment and various purification processes including BMT; BMT-80CH, labeled "+80CH"; BMT-80CH-1400, labeled +1400; BMT-80CH-1400-HCl, labeled "+HCl"; and BMT-80CH-1400-HCl—NaOH, labeled "+NaOH"; and ash content of the samples following the heating profile is shown adjacent the labeled traces.

Ash content increases with milling, from 6.6 wt % to 24 wt %, and can be attributed to attrition of the steel balls and bowl during the milling process, FIG. 8. Ball milling of the samples leads to a lower oxidation temperature, the primary oxidation peak of BMT-80CH (beginning at ~425° C.) is ~25° C. lower than BMT, FIG. 8, and additional high-temperature oxidation is significantly reduced. This shift in TPO is consistent with added metals, increased carbon reactivity, and a decrease in particle size as a result of milling.

Heat treatment at 1400° C. broadens the primary TPO peak and removes a low-temperature peak (at 75° C.) associated with volatile hydrocarbons. This peak broadening may be an indication of the formation of cross-links leading to more oxidation resistant carbon structures, and possibly, the introduction of carbides as FeC is also believed to oxidize in this temperature range. The reduction in ash content with thermal anneal (from 24% to 17.9%) is unexpected, as thermal anneal is expected to remove volatile organic components without removing metals, thereby increasing the ash content.

The asymmetry in TPO of BMT-80CH-1400-HCl indicates a change in carbon structure, consistent with Raman analysis. The asymmetry suggests multiple oxidation reactions and/or multiple types of carbon reaction sites. The HCl treatment did not significantly affect ash content, suggesting iron, and other metal, species are enclosed in carbon structures and inaccessible to acid. After NaOH treatment, the asymmetry in the primary TPO peak is gone, but a small secondary peak is present at ~625° C. The reaction leading to a small secondary TPO peak is not clear, Raman and XRD analysis indicated the formation of oxides after NaOH treatment. NaOH may also react directly with reactive carbons, leading to carbon restructuring and possible hydrogen abstraction.

Somewhat unexpectedly, the 10N NaOH treatment increased the ash content by ~4%. This can be explained by the presence of FeC prior to NaOH treatment. FeC is believed to form $Fe_3O_4$ in oxygen at temperatures of 500° C., Caplan D, et al., Oxid Met 1978; 12(1):67-82, and $Fe_3C$ will also form $Fe_3O_4$. Oxidation of iron carbides in TPO thus leads to a mass increase of 14 and 29 wt % for FeC and $Fe_3C$, respectively. TPO of iron carbides confirms this. Thus, if metal carbides are initially present in the sample the residual ash will form metal oxides and the ash content may be lower than expected based on metal content. As XRD of BMT, BMN-80CH, BMT-80CH-1400, and BMT-80CH-1400-HCl—NaOH all show the presence of metal carbides, the measured ash content may overestimate the total metal present at the beginning of TPO. Raman and XRD analysis of BMT-80CH—HCl—NaOH also shows the presence of metal oxides, thus the ash content of BMT-80CH-1400-HCl—NaOH has less of a mass increase upon oxidation of the carbide precursors, and the apparent ash content is increased.

Embodiments of Methods According to Embodiments of Methods of the Present Invention Including Ball Milling, Acid-Treatment and/or Base Treatment of Materials, Without Thermal Anneal of the Materials.

Figure 9A:
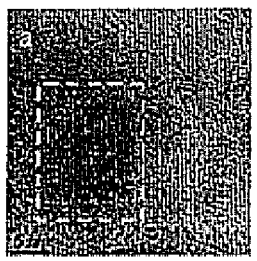
FIG. 9A is an ER-TEM image of material processed according to a method according to the present invention including purification without thermal treatment and shows crystalline carbon surrounded by amorphous carbon.
Figure 9B:
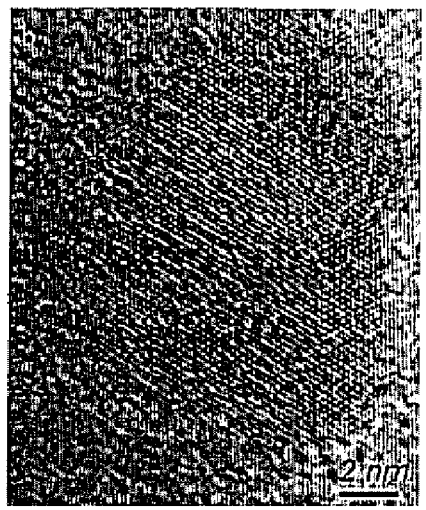
FIG. 9B is a high-resolution HR-TEM image of the region indicated in FIG. 9A of material processed according to a method according to the present invention including purification without thermal treatment and shows material in the indicated region to be highly crystalline.
Figure 9C:
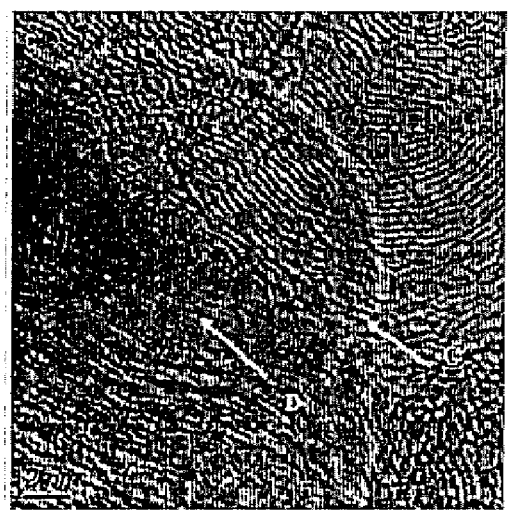
FIG. 9C is a high-resolution HR-TEM image of the region indicated in FIG. 9A of material processed according to a method according to the present invention including purification without thermal treatment and exposed to electron irradiation resulting in conversion to bucky diamonds, labeled "D", and carbon onions labeled "G"

Omitting the thermal anneal led to the observation of a crystalline carbon region in TEM of BMT-80CH—HCl—NaOH. Crystalline carbon regions are converted to bucky diamond in the TEM. A crystalline carbon region in BMT-80CH—HCl—NaOH first surrounded by amorphous carbon is shown in FIG. 9A. HRTEM of the central-core indicates a diamond-like structure, FIG. 9B, yet this region does not match the structure of diamond or graphite. The region converts to carbon onions and NCD with increased exposure to the electron beam, FIG. 9C. NCD is readily transformed into carbon onions at high temperature, Kuznetsov V L, et al., Chem Phys Lett 1994; 222(4):343-8, and the reverse transformation from onions into NCD has been observed upon electron irradiation, Banhart F, Ajayan P M. Nature 1996; 382(6590):433-5; Banhart F, Ajayan P M. Self-compression and diamond formation in carbon onions. Adv Mater 1997; 9(3):261; Zaiser M, et al., Rev B 2000; 62(5):3058-64; Zaiser M, Banhart F. Phys Rev Lett 1997; 79(19):3680-3. Kuznetsov et al., have extensively studied the mechanism of the NCD to carbon onion transition, and proposed a mechanism for this transition, Kuznetsov V L, et al., Carbon 2004; 42(5-6):1057-61. In literature reports, the number of experimental observations of graphite encapsulated nanodiamonds, or bucky diamonds, exceeds the number of observations of 'true' NCD or carbon onions. The conversion of carbon nanotubes directly into NCD has been observed at high pressure, Yusa H. Diam Relat Mater 2002; 11(1):87-91.

TPO and Raman Spectroscopy for embodiments of methods according to the present invention including ball milling, acid-treatment and/or base treatment of materials, without thermal anneal of the materials.

TPO indicates the ash content decreases with the first HCl treatment (from 9.5% to 6.7%). This is in contrast to methods including thermal anneal, verifying the thermal anneal renders the metals inaccessible to acid, FIG. 10. Treatment with 10N NaOH once again unexpectedly increases ash content (from 6.7% to 11.2%). This can again be explained by the relative amounts of metal carbides versus metal oxides as discussed above. However, $Fe_2O_3$ peaks are not found in Raman spectroscopy of samples processed without thermal anneal. Rather, there is an increased photoluminescence relative to prior stages in synthesis and other low frequency peaks that are likely associated with other metal oxides, FIG. 11. Given the iron content of the sample, the sharp peak at 1087 $cm^{-1}$ for BMT-80CH—HCl—NaOH bears a striking resemblance to those assigned to iron carbides after electrochemical oxidation of carbon steel [26]. It is noted that the sharp peaks at 1087 $cm^{-1}$ did not match the room light frequency, and consisted of several data points, ruling out cosmic rays. TPO is significantly shifted after HCl treatment, demonstrating HCl led to changes in the carbon structure as is the case in material processed including a thermal anneal.

Figure 10:
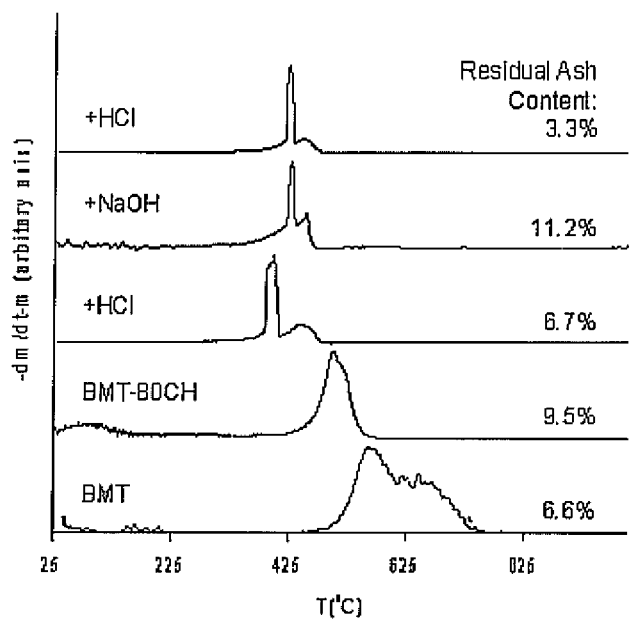
FIG. 10 shows results of temperature programmed oxidation of material processed according to methods of the present invention including with and without ball milling, thermal treatment and various purification processes including BMT; BMT-80CH; BMT-80CH—HCl, labeled "+HCl"; BMT-80CH—HCl—NaOH, labeled "+NaOH"; and BMT-80CH—HCl—NaOH—HCl, labeled "+HCl" and positioned above the trace labeled "+NaOH"; ash content of the samples following the heating profile is shown adjacent the labeled traces.
Figure 11:
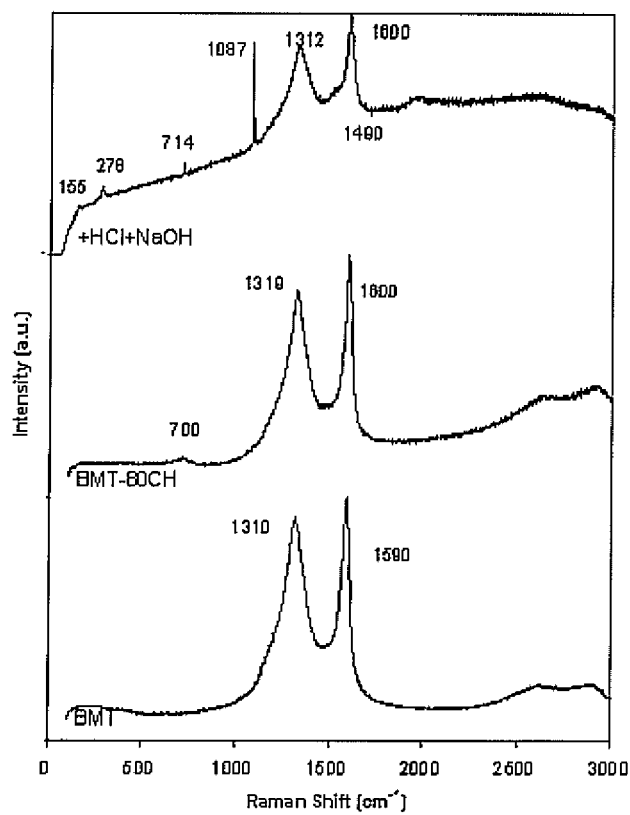
FIG. 11 shows Raman spectra of materials including BMT; BMT-80CH; and BMT-80CH—HCl—NaOH, labeled "+HCl+NaOH."

Evidence for metal transformation in material processed without thermal anneal is provided by embodiments of inventive methods including a second HCl treatment, which reduced the ash content, from 11.2% to 3.3%, FIG. 10. This is less than the ash content after a first HCl treatment. Without wishing to be bound by theory, it is believed that this indicates that (1) any metals or metal carbides present after ball milling are not accessible to acid, (2) the metal carbides are converted, in part, to metal oxides after treatment with NaOH, and (3) the metal oxides formed by the NaOH treatment are then soluble in a second HCl treatment.

A crystalline carbon region observed in materials treated according to methods of the present invention without thermal anneal does not match known carbon forms. The crystalline region of these regions is highly unstable, and converted to NCD and carbon onions via electron irradiation. It is of note that this crystalline feature is observed only after the NaOH treatment. 4 M HCl treatment significantly alters carbon structure, with a pronounced bimodal reactivity apparent in TPO. TPO, when combined with Raman and a second HCl treatment, suggest conversion of metal carbides to metal oxides via the 10N NaOH treatment.

Any patents or publications mentioned in this specification are incorporated herein by reference to the same extent as if each individual publication is specifically and individually indicated to be incorporated by reference. In particular, U.S. Provisional Patent Application Nos. 60/752,506 and 60/752,507, both filed Dec. 21, 2005, are both hereby incorporated by reference in their entirety.

The compositions and methods described herein are presently representative of preferred embodiments, exemplary, and not intended as limitations on the scope of the invention. Changes therein and other uses will occur to those skilled in the art. Such changes and other uses can be made without departing from the scope of the invention as set forth in the claims.

We claim:

1. A process for synthesizing a diamond material, comprising:
    subjecting a composition comprising coal to high kinetic energy milling under system reaction conditions, producing a milled product; and
    treating the milled product by heating and exposure to acid, thereby synthesizing a diamond material.

2. The process for synthesizing a diamond material of claim 1, wherein the milled product is enriched in hydrogenated tetrahedral amorphous diamond-like carbon compared to the coal.

3. The process for synthesizing a diamond material of claim 1, further comprising treating the milled product by exposure to a base.

4. The process of claim 1, wherein the system reaction conditions comprise moderate pressure.

5. The process of claim 4, wherein the moderate pressure is a pressure in the range of about 0.9-10 atm.

6. The process of claim 1, wherein the system reaction conditions comprise moderate temperature.

7. The process of claim 6, wherein the moderate temperature is a temperature in the range of about 0-100° C., inclusive.

8. The process of claim 1, wherein the composition further comprises a hydrogen source.

9. The process of claim 8, wherein the composition further comprises a hydrocarbon.

10. The process of claim 9, wherein the hydrocarbon is an unsaturated hydrocarbon.

11. The process of claim 1, wherein the high kinetic energy milling comprises ball milling.

12. The process of claim 1, wherein the coal is an anthracite.

13. The process of claim 1, wherein the coal is selected from the group consisting of anthracite, lignite, bituminous, sub-bituminous and a combination thereof.

14. The process of claim 1, further comprising adding energy to a produced crystalline carbon to produce a bucky diamond.

15. The process of claim 14, wherein the energy is added by a process selected from the group consisting of: heating, irradiating and a combination thereof.

16. A process for synthesizing a synthetic crystalline diamond-like carbon material; comprising:

subjecting a composition comprising coal to high kinetic energy milling under system reaction conditions, producing a milled product; and exposing the milled product to an acid, a base, or a combination thereof, thereby synthesizing a synthetic crystalline diamond-like carbon material.

17. The process of claim 16 wherein the milled product is characterized by presence of tetrahedral amorphous diamond-like carbon form during milling.

18. A process for synthesizing a nanocrystalline diamond; comprising:

subjecting a composition comprising coal to high kinetic energy milling under system reaction conditions, producing a milled product;

thermally treating the milled product to produce a thermally treated milled product;

exposing the thermally treated milled product to an acid, a base, or a combination thereof, thereby synthesizing a nanocrystalline diamond.

19. The process of claim 18 wherein the milled product is characterized by presence of tetrahedral amorphous diamond-like carbon formed during milling.

20. The process of claim 18 wherein the thermally treated milled product is characterized by presence of a metal carbide formed during thermal treatment.

21. The process of claim 18 wherein exposing the thermally treated milled product to an acid, a base, or a combination thereof, is characterized by extraction of a metal from a metal carbide formed during thermal treatment.

* * * * *

UNITED STATES PATENT AND TRADEMARK OFFICE
CERTIFICATE OF CORRECTION

| | | |
|---|---|---|
| PATENT NO. | : 7,754,179 B2 | Page 1 of 1 |
| APPLICATION NO. | : 11/613968 | |
| DATED | : July 13, 2010 | |
| INVENTOR(S) | : Angela Lueking et al. | |

It is certified that error appears in the above-identified patent and that said Letters Patent is hereby corrected as shown below:

Col. 1 lines 12-16 should read,

This invention was made with government support under Grant No. DE-FC26-03NT41874, awarded by the Department of Energy. The Government has certain rights in the invention.

Signed and Sealed this

Second Day of November, 2010

David J. Kappos
*Director of the United States Patent and Trademark Office*